United States Patent
Dhindsa et al.

(10) Patent No.: US 6,824,627 B2
(45) Date of Patent: Nov. 30, 2004

(54) STEPPED UPPER ELECTRODE FOR PLASMA PROCESSING UNIFORMITY

(75) Inventors: Rajinder Dhindsa, San Jose, CA (US); Mukund Srinivasan, Fremont, CA (US); Aaron Eppler, El Cerrito, CA (US); Eric Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 322 days.

(21) Appl. No.: 10/139,364

(22) Filed: May 7, 2002

(65) Prior Publication Data

US 2002/0187647 A1 Dec. 12, 2002

Related U.S. Application Data

(62) Division of application No. 09/689,845, filed on Oct. 13, 2000, now Pat. No. 6,391,787.

(51) Int. Cl.[7] .............................................. H01L 21/20
(52) U.S. Cl. ..................... 156/60; 438/710; 118/723 R
(58) Field of Search .................. 156/60, 345; 438/706, 438/707, 710, 729; 118/720, 721, 723 R, 723 E, 724, 728, 50, 50.1, 620, 626, 631

(56) References Cited

U.S. PATENT DOCUMENTS

| | | |
|---|---|---|
| 4,230,515 A | 10/1980 | Zajac |
| 4,297,162 A | 10/1981 | Mundt et al. |
| 4,579,618 A | 4/1986 | Celestino et al. |
| 4,610,774 A | 9/1986 | Sakata et al. |
| 4,767,641 A | 8/1988 | Kieser et al. |
| 4,792,378 A | 12/1988 | Rose et al. |
| 4,820,371 A | 4/1989 | Rose |
| 4,960,488 A | 10/1990 | Law et al. |
| 5,074,456 A | 12/1991 | Degner et al. |
| 5,273,588 A | 12/1993 | Foster et al. |
| 5,298,103 A | 3/1994 | Steinberg et al. |
| 5,422,139 A | 6/1995 | Fischer |
| 5,472,565 A | 12/1995 | Mundt et al. |
| 5,522,934 A | 6/1996 | Suzuki et al. |
| 5,569,356 A | 10/1996 | Lenz et al. |
| 5,571,366 A | 11/1996 | Ishii et al. |
| 5,593,540 A | 1/1997 | Tomita et al. |
| 5,628,869 A | 5/1997 | Mallon |
| 5,643,394 A | 7/1997 | Maydan et al. |
| 5,714,031 A | 2/1998 | Mundt et al. |
| 5,716,485 A | 2/1998 | Salimian et al. |
| 5,746,875 A | 5/1998 | Maydan et al. |
| 5,779,803 A | 7/1998 | Kurono et al. |
| 5,990,016 A | 11/1999 | Kim et al. |
| 6,010,636 A | 1/2000 | Donohue et al. |
| 6,073,577 A | 6/2000 | Lilleland et al. |
| 6,074,518 A | 6/2000 | Imafuku et al. |
| 6,123,775 A | 9/2000 | Hao et al. |
| 6,391,787 B1 * | 5/2002 | Dhindsa et al. ............. 438/710 |

FOREIGN PATENT DOCUMENTS

| | | |
|---|---|---|
| EP | 0693769 | 1/1996 |
| JP | 10-64831 | 3/1998 |
| WO | WO 01/50498 | 7/2001 |

* cited by examiner

Primary Examiner—Blaine Copenheaver
Assistant Examiner—John T. Haran
(74) Attorney, Agent, or Firm—Burns, Doane, Swecker & Mathis, LLP (57) ABSTRACT

A plasma discharge electrode having a front surface with a central portion thereof including gas outlets discharging a process gas which forms a plasma and a peripheral portion substantially surrounding the gas outlets. The peripheral portion has at least one step for controlling a density of the plasma formed by the electrode. The electrode can be used as the grounded upper electrode in a parallel plate plasma processing apparatus such as a plasma etching apparatus. The geometric features of the step and of a corresponding edge ring on the lower electrode can be varied to achieve the desired etch rate profile across a wafer surface.

15 Claims, 9 Drawing Sheets

FIG. 6A
Standard HP Hardware

Edge: 5 mm

FIG. 6B center

FIG. 6C
8.6" Step on Upper Electrode

Edge: 5 mm

FIG. 6D center

FIG. 7

STEPPED UPPER ELECTRODE FOR PLASMA PROCESSING UNIFORMITY

This application is a divisional application of U.S. application Ser. No. 09/689,845, filed on Oct. 13, 2000, now U.S. Pat. No. 6,391,787, the entire content of which is hereby incorporated by reference.

BACKGROUND OF THE INVENTION

1. Field of the Invention

The present invention generally relates to etching with high energy radiation or plasma, and more particularly, to a method and apparatus for controlling the etching rate at the edge of a wafer in an integrated semiconductor circuit manufacturing process.

2. Description of the Related Art

Since the mid-1960s, integrated semiconductor circuits have become the primary components of most electronics systems. These miniature electronic devices may contain thousands of the transistors and other circuits that make up the memory and logic subsystems of microcomputer central processing units. The low cost, high reliability, and speed of these computer chips has led them to become a ubiquitous feature of modem digital electronics.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive, material called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating covering the resist.

The lithographed resist pattern is then transferred onto the underlying crystalline surface of the semiconductor material through a process known as etching. Traditional etching processes employed wet chemicals that proved to be limited in terms of the size and aspect ratio (i.e., the height to width ratio of the resulting notch) of the features that could be formed on the wafer. Consequently, the number of circuits that could be packed onto a single wet-etched wafer, and hence the ultimate size of the electronic device, were limited by traditional chemical etching processes.

Dry plasma etching, reactive ion etching, and ion milling techniques were later developed in order to overcome the limitations associated with chemical etching. Plasma etching, in particular, allows the vertical etch rate to be made much greater than the horizontal etch rate so that the resulting aspect ratio of the etched features can be adequately controlled. In fact, plasma etching enables very fine features with high aspect ratios to be formed in films approaching 1 micrometer in thickness.

During the plasma etching process, a plasma is formed above the masked surface of the wafer by adding large amounts of energy to a gas at low pressure. This is commonly accomplished by creating electrical discharges in gases at about 0.001 atmospheres. The resulting plasma may contain ions, free radicals, and neutral species with high kinetic energies. By adjusting the electrical potential of the substrate to be etched, the charged particles in the plasma can be directed to impinge upon the unmasked regions of the wafer and thereby remove atoms from the substrate.

The etching process can often be made more effective by using gases that are chemically reactive with the material being etched. So called "reactive ion etching" combines the energetic etching effects of the plasma with the chemical etching effect of the gas. However, many chemically active agents have been found to cause excessive electrode wear.

It is desirable to evenly distribute the plasma over the surface of the wafer in order to obtain uniform etching rates over the entire surface of the wafer. For example, U.S. Pat. Nos. 4,792,378 and 4,820,371 to Rose et al. disclose a shower head electrode for distributing gas through a number of holes in the electrode. These patents generally describe a gas dispersion disk having an arrangement of apertures which is tailored to the particular pressure gradients existing within a reactor chamber in order to provide a uniform flow of gas vapors to a semiconductor wafer. The gas dispersion disk is intended to function as a selective barrier to counteract gradient pressures below the disk and to provide a uniform flow through the shower head electrode for distribution over the entire surface of the wafer. Any discontinuities or irregularities in the plasma discharge system, such as pumping ports, may also affect the density of the plasma being generated below the showerhead.

Since the integrated circuit fabrication process is quite sensitive to both particulate and impurity contamination, even airborne particulate matter as small as 1 micrometer must be prevented from contacting the surface of the wafer during the etching process. Consequently, it is often desirable to confine the plasma to the area which is immediately over and around the wafer substrate. For example, Sakata et al. (U.S. Pat. No. 4,610,774) discloses an annular wall around a sputtering target that can repulse, and return toward the center, those electrons which tend to escape from the plasma during the sputtering process. Similarly, Ishii et al. (U.S. Pat. No. 5,571,366) disclose a gas supplying means for a plasma processing apparatus having an annular projection around the perimeter thereof which operates to concentrate a gas to the target surface of the object to be processed. Maydan et al. (U.S. Pat. No. 5,643,394) disclose a plasma chamber lid having an annular reflector designed to focus an injected gas toward the center of a wafer being processed.

Plasma processing is typically conducted in a parallel plate reactor apparatus wherein the reactor volume is defined by a pair of closely spaced electrode plates. Examples of parallel plate plasma processing reactors for processing semiconductor substrates such as silicon wafers are disclosed in U.S. Pat. Nos. 4,960,488; 5,074,456; 5,569,356; and 6,073,577. The use of planar electrodes in a parallel plate plasma reactor, however, can result in a non-uniform plasma density across the surface of the substrate. Typically, the plasma density in the region near the edge of the substrate is less than that at the center. Thus, using a conventional parallel plate reactor in a plasma etching process can result in reduced etch rates near the edge of the substrate being processed.

Shaped electrodes have been disclosed to improve uniformity in plasma processes. See, for example, Mundt et al. (U.S. Pat. No. 4,297,162), Kim et al. (U.S. Pat. No. 5,990, 016), Mallon (U.S. Pat. No. 5,628,869), Donohue et al. (U.S. Pat. No. 6,010,636), Salimian (U.S. Pat. No. 5,716,485), Zajac (U.S. Pat. No. 4,230,515). See also two commonly owned patents issued to Mundt et al. (U.S. Pat. No. 5,472, 565 and U.S. Pat. No. 5,714,031).

SUMMARY OF THE INVENTION

The present invention provides an electrode for use in a plasma reaction chamber. The electrode has a central portion including plurality of gas outlets through which process gas can be delivered from an exposed surface of the electrode. A step is located in a peripheral portion of the electrode and extends at least partially around the central portion of the electrode. The step can enhance the density of the plasma formed adjacent the exposed surface of the electrode. The central portion of the electrode can be substantially planar. In a preferred embodiment, the step is located inwardly of an outer periphery of the electrode such that the electrode extends beyond the step.

The present invention also provides a method of treating a semiconductor substrate in a plasma chamber. The method comprises: supporting a substrate on a bottom electrode; supplying a process gas to the chamber; forming a plasma adjacent an exposed surface of an upper electrode; and processing the semiconductor substrate with the plasma. The upper electrode has a central portion and a peripheral portion which includes a step projecting from an exposed surface thereof and extending at least partially around the central portion. The step provides a predetermined localized plasma density adjacent the exposed surface of the electrode. The upper electrode can be a showerhead electrode having a central portion with one or more gas outlets for discharging the process gas into the chamber.

The present invention also provides a plasma chamber for use in manufacturing a semiconductor device. The plasma chamber includes a top electrode and a bottom electrode having respective surfaces facing each other and spaced apart from one another to define a gap therebetween. The bottom electrode comprises a substrate support. The top electrode includes a central portion and a step projecting from a peripheral portion thereof and extending at least partially around the central portion. The step affects the localized density of the plasma formed adjacent the exposed surface of the top electrode in the step region. The chamber can also include an edge ring mounted on the bottom electrode. The edge ring can act in conjunction with the step on the upper electrode to provide a predetermined localized plasma density adjacent the exposed surface of the electrode

BRIEF DESCRIPTION OF THE DRAWINGS

The invention will now be further described with reference to the following figures:

FIGS. 6A–D are micrographs of etched features wherein

DETAILED DESCRIPTION OF THE INVENTION

The invention provides a novel arrangement for improving uniformity during plasma processing of semiconductor substrates such as silicon wafers, flat panel display substrates, and the like. The improved plasma processing is achieved by modifying the plasma density in a peripheral region of the substrate being processed. Improved uniformity can be achieved through use of a stepped electrode. Further improvements can be obtained by modifying the material, shape and/or powering of a hot edge ring (HER) surrounding the substrate being processed.

The stepped electrode according to the present invention may be applied to plasma etching processes in order to enhance the density of a plasma near the edge of a wafer in a parallel plate plasma reaction chamber so as to produce a more uniform etch rate across the substrate. Although the present invention will be described in terms of its advantages for plasma etching, the present invention is also useful for other applications that may require plasmas with uniform densities such as plasma enhanced chemical vapor deposition and plasma cleaning.

The present invention provides a showerhead electrode having a central portion and a peripheral portion having a step which can control a localized density of a plasma formed by the electrode. The peripheral portion includes at least one step in a surface of the electrode facing a semiconductor substrate such as a wafer. The step can be shaped to change the plasma density by varying the localized power coupling from the bottom electrode. Using a step on a top electrode in combination with an edge ring on the lower electrode allows for an even greater degree of control over the edge etch rate. By using different materials for the step and edge ring, the degree of coupling through the plasma in the edge region can be further adjusted. Additionally, various geometric features of the step and edge ring can also be modified to produce a desired etch rate profile. In a preferred embodiment, the step is located inwardly of an outer periphery of the electrode such that the electrode extends beyond the step. In another preferred embodiment, the central portion of the electrode and/or the portion of the electrode extending beyond the step are substantially planar.

The present invention also relates to a method of treating a semiconductor substrate with a plasma including the steps of forming plasma between the substrate and an opposing electrode, the opposing electrode having a peripheral portion including at least one step. The step locally enhances the density of the plasma adjacent the peripheral portion of the electrode thus allowing for control of the edge etch rate of the wafer.

The stepped electrode according to the present invention offers several advantages. First, it allows for the localized enhancement, or intensification, of the plasma density near the edge of a substrate such as a silicon wafer during plasma processing. The shape, dimensions, and location of the step by itself or in cooperation with an edge ring on a lower electrode supporting the substrate may be optimized to provide uniform etching for a variety of different process regimes. Furthermore, the etch uniformity may be optimized without significantly affecting other etch characteristics such as the etch rate at the center of the wafer. The stepped electrode is also suitable for many different electrode materials and process gases.

In the present invention, the etch rate near the edge of the wafer is controlled by varying the localized power coupling through the plasma. Namely, by placing a step or projection on the upper electrode, more of the current is coupled through the plasma in the region near the edge of the wafer. The step on the upper electrode also causes the plasma sheath to conform to the profile of the step which helps maintain a more uniform plasma density while increasing the energy of the ions in the edge region.

A shower head electrode is a preferred stepped electrode that may be used according to the present invention. The shower head electrode preferably includes a plurality of gas outlets extending between opposed front and rear surfaces of the electrode. The gas outlets can be located in a central portion of the front surface for discharging a process gas in an area near the front surface of the electrode. A peripheral portion of the front surface of the shower head electrode surrounds the central portion of the front surface. The step is located at the peripheral portion of the electrode and extends at least partially, preferably completely, around the central portion of the electrode. The step controls a localized density of the plasma formed adjacent the exposed surface of the electrode. A preferred plasma reaction chamber incorporating the stepped showerhead electrode is a semiconductor etching apparatus.

The top electrode may be formed of any suitable material such as graphite, silicon, silicon carbide and aluminum. The step may be an integral part of a monolithic one-piece stepped electrode (e.g., machined or otherwise formed in a single piece of material) or may be made as a separate piece and bonded (e.g., metallurgically or adhesively) or otherwise secured to the electrode surface. The step may be made from the same material as the electrode or from a different material. As with the electrode, the step insert may also be made from materials such as graphite, silicon, silicon carbide or aluminum. However, the step may be made from dielectric materials such as quartz.

In another preferred embodiment of the invention, the step on the upper electrode has an inner surface adjacent to the central portion of the electrode, a bottom surface substantially parallel to a substantially planar central portion of the electrode and an outer surface opposite the inner surface. The inner surface of the step is preferably inclined so as to form an obtuse angle with respect to the substantially planar central portion of the electrode. The step, for example, may be trapezoidal in transverse cross-section. In another preferred embodiment, the inner surface of the step forms an angle of 120 to 160 degrees with the substantially planar central portion of the top electrode and the outer surface of the step forms an angle of 80 to 90 degrees with respect to a plane parallel to the substantially planar central portion of the electrode.

In another preferred embodiment of the invention, a method of treating a semiconductor substrate in a plasma chamber includes the steps of mounting a substrate on a lower electrode, discharging process gas into the chamber, forming a plasma adjacent an exposed surface of an upper electrode and processing the substrate with the plasma. The electrode has a central portion and a peripheral portion including a step projecting from an exposed surface thereof and extending at least partially around the central portion. The step geometry can be tailored to provide a predetermined localized density of the plasma formed adjacent the exposed surface of the electrode. In another preferred embodiment, the semiconductor substrate comprises a semiconductor wafer and the processing step comprises etching the semiconductor wafer with the plasma. The showerhead electrode is preferably electrically grounded and the bottom electrode is electrically powered during the processing step.

In a further preferred embodiment, the plasma is formed in a gap between the showerhead electrode and a bottom electrode and the method further comprises the steps of transferring the semiconductor substrate out of the plasma chamber and transferring a further semiconductor substrate into the plasma chamber and onto the bottom electrode.

In another preferred embodiment of the invention, a plasma chamber for use in manufacturing a semiconductor device includes a top electrode and a bottom electrode having respective surfaces facing each other and spaced apart from one another to define a gap. The bottom electrode comprises a substrate support. The top electrode comprises a central portion and a step located at a peripheral portion of the top electrode and extending at least partially around the central portion of the top electrode. The step controls a localized density of the plasma formed adjacent the exposed surface of the top electrode.

In another preferred embodiment of the plasma chamber, the top electrode is grounded and the bottom electrode is powered during processing. However, both electrodes, may be powered or the bottom electrode can be grounded and the top electrode can be powered.

In another preferred embodiment, the bottom electrode further includes a sacrificial edge ring surrounding an electrostatic chuck (ESC). The edge ring is a replaceable component which tends to become hot during processing of a substrate and thus is referred to as a hot edge ring (HER). The edge ring may be made from conductive electrode materials such as SiC and silicon or from dielectric materials such as quartz. By changing the edge ring material, the degree of coupling through the plasma can be tailored to provide a desired localized "edge" etch rate at the outer portion of a substrate being processed. SiC, having a lower capacitive impedance, will generally produce a faster edge etch rate than silicon. Quartz and other dielectrics will have a lesser effect on the edge etch rate.

Several of the drawings discussed below show graphs of etch rate uniformity using stepped and conventional flat upper electrode arrangements.

Figure 1A:
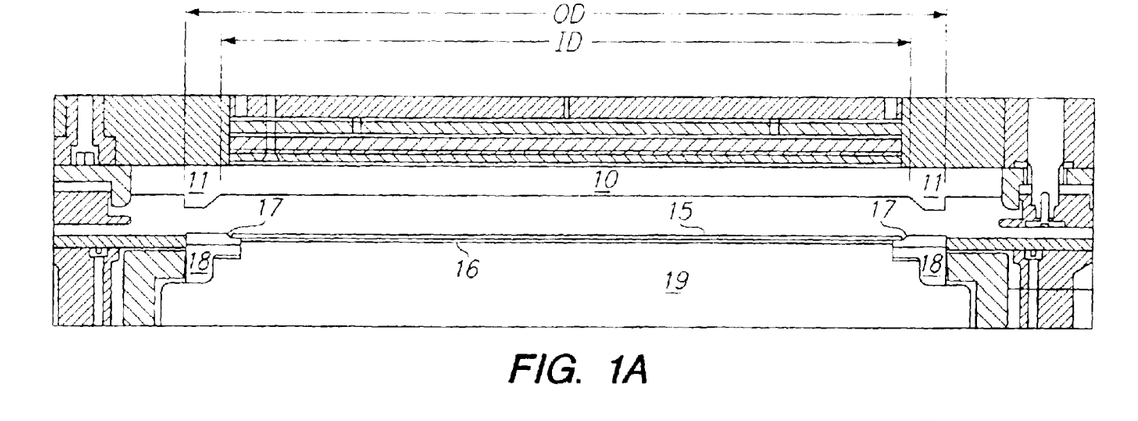
FIG. 1A shows a stepped upper electrode according to an embodiment of the present invention wherein the electrode is mounted in a parallel plate plasma apparatus.

FIG. 1A shows a cross-sectional view of a parallel plate plasma apparatus according to the invention. The upper electrode 10 has a step 11 in a peripheral portion thereof. The step has an inside diameter (ID) and an outside diameter (OD). A substrate or wafer 15 is mounted on a substrate support 19 incorporating an electrostatic chuck 16 therein. The substrate support also includes an edge ring 17 and a coupling ring 18. The step 11 includes an inclined inner surface facing the wafer 15, a bottom surface parallel to the wafer 15 and an outer surface perpendicular to the wafer 15, the outer surface being located inwardly from an outer periphery of the electrode 10.

Figure 1B:
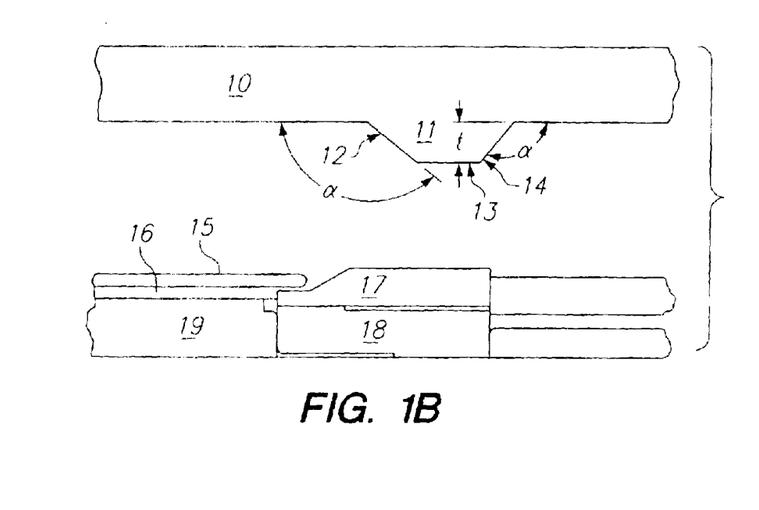
FIG. 1B shows a detail of the wafer edge region of a parallel plate plasma apparatus with an integral step according to another embodiment of the invention.

FIG. 1B shows a detail of the wafer edge region of a parallel plate plasma apparatus according to a further embodiment of the present invention. The upper electrode 10 is a one-piece monolithic electrode with an integral step 11. The step 11 has a thickness (t) and an inner surface 12 which forms an angle ($\alpha$) with the central portion of the upper electrode. The step also has a bottom surface 13 and an outer surface 14 which forms an angle ($\gamma$) with a plane parallel to the substantially planar central portion of the electrode. As in the embodiment of FIG. 1A, the step 11 is located opposite the edge ring 17.

Figure 1C:
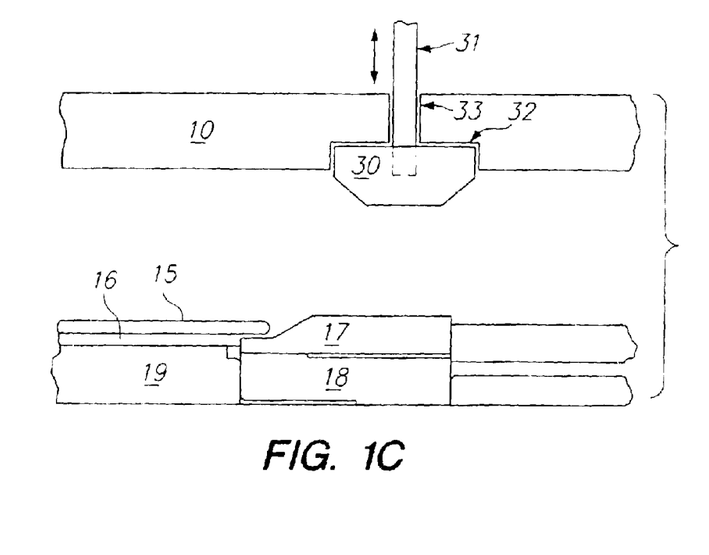
FIG. 1C shows a detail of the wafer edge region of a parallel plate plasma apparatus with a separate step having an adjustable thickness according to another embodiment of the invention.

FIG. 1C shows a detail of the wafer edge region of a parallel plate plasma apparatus according to another embodiment of the present invention. The upper electrode 10 includes a step 30 formed by a separate piece of material. A groove 32 is shown extending into the exposed surface of the upper electrode. The separate step 30 fits into the groove 32 and projects from the surface of the electrode. The thickness of the step 30 relative to the exposed surface of the electrode can be adjusted by an actuator 31 connected to the step through an opening 33 in the upper electrode. The position of the actuator 31 and hence the step thickness can thus be adjusted to a suitable value such as by a mechanism controlled from outside of the process chamber. This arrangement allows for the effective step thickness to be adjusted without replacing either the step or the entire upper electrode such as, for example, when processing different substrates and/or using different process gas chemistries. Further, by using this arrangement, the thickness of the step can be changed between steps of a multi-step plasma process (e.g., dual damascene processing) without opening the plasma chamber.

Figure 2A:
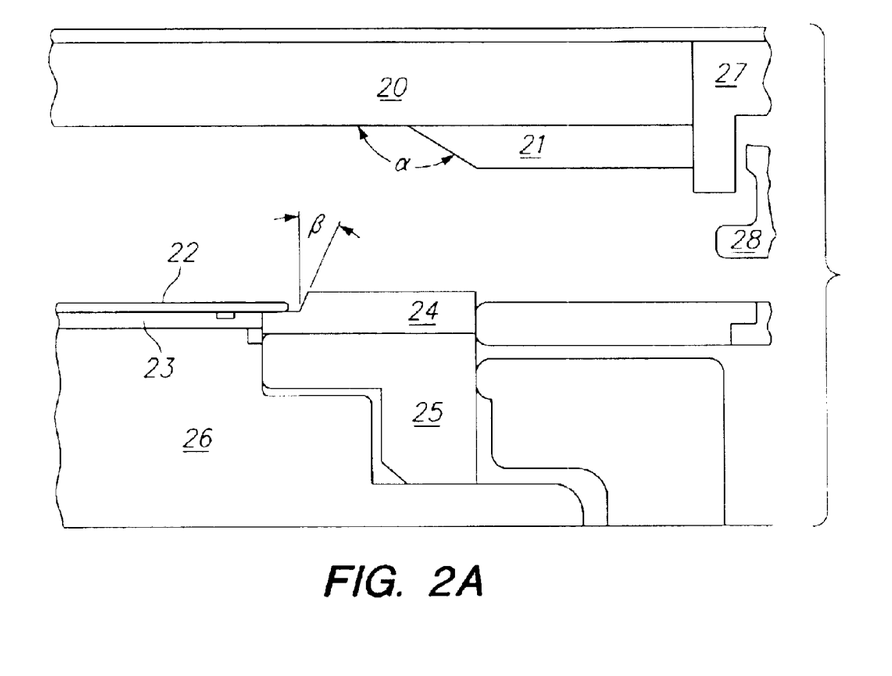
FIG. 2A shows a detail of the wafer edge region of a single wafer parallel plate plasma apparatus according to the invention.

FIG. 2A shows a detail of the wafer edge region of a parallel plate plasma apparatus according to an embodiment of the invention wherein the step extends to the outer edge of the electrode. A semiconductor substrate in the form of a wafer 22 is mounted on a substrate support 26 using an electrostatic chuck 23. In the embodiment shown, the wafer has a diameter of 8 inches (200 mm). It will be appreciated, however, that the invention is also applicable to wafers or substrates of other sizes. For an 8 inch wafer, the inside diameter (ID) of the step 21 can be set at 8.6 inches such that the step 21 begins approximately 0.3 inches beyond or outside of the edge of the wafer 22. The step outside diameter is the same as that of the electrode (10.35 inches) and the step thus contacts a fixed guard 27. The fixed guard acts in conjunction with a movable confinement ring 28 to focus the plasma on the wafer surface. The step 21 has an inclined surface forming an angle ($\alpha$) of 150 degrees with the exposed surface of the electrode and the step thickness is 0.125 inches. A quartz coupling ring 25 and a silicon hot edge ring 24 surround the substrate support 26. The inner surface of the edge ring is beveled to form an angle $\beta$ with a plane perpendicular to the wafer surface. The upper electrode 20 is made of silicon and the step 21 is shown as a separate ring which is secured (via any suitable technique such as bonding or mechanical attachment) to the upper electrode.

The data in the graphs discussed below was generated using a dual frequency parallel plate plasma etch reactor. In all cases, power (dual frequencies) was applied only to the lower electrode and the upper electrode was grounded with a gap between the electrodes of about 1.3 cm.

Figure 2B:
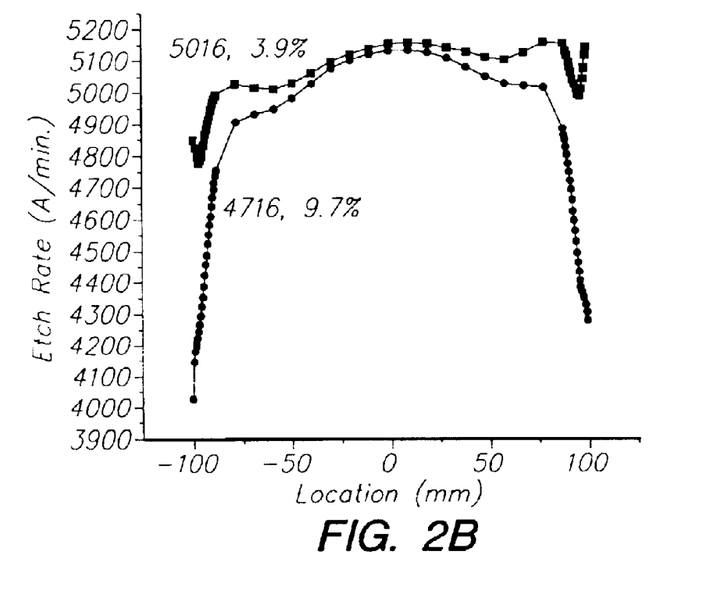
FIG. 2B is a graph showing the etch rate profile across a wafer for a blanket oxide etch using the arrangement of FIG. 2A with an 8.6 inch ID stepped upper electrode compared to an etch rate profile using a conventional flat upper electrode.

FIG. 2B is a graph showing the etch rate profile in a blanket oxide etch using the arrangement of FIG. 2A (■) compared to a blanket oxide etch using a conventional flat upper electrode (●). In both cases, a silicon hot edge ring and quartz coupling ring were used and etching was carried out under the following conditions: 1500 Watts RF power at 27 MHz; 1100 Watts RF power at 2 MHz; 52 mTorr chamber pressure above the wafer; 135 sccm argon gas; 15 sccm $C_4F_8$ gas; 10 sccm $O_2$ gas; $-10°$ C. temperature of bottom electrode; and 60 second process time.

The graph shows the etch rate in Angstroms/minute as a function of location on the wafer surface measured from the center of the wafer. As can be seen from the graph, the step produces a dramatic improvement in etch rate uniformity near the wafer edge. The numbers beside each plot are the average etch rate and the etch rate uniformity. Etch rate uniformity is calculated by the following equation:

$$[(Max-Min)/2*Average]*100\%$$

where Max is the maximum value of etch rate and Min is the minimum value of etch rate. The etch rate was determined by measuring the thickness of the wafer before and after etching using an ellipsometer available from Rudolph Technologies. A 0.5 mm area near the edge of the wafer was excluded from the thickness measurement. Measurements were then taken every 0.5 mm in a 12 mm region adjacent the edge exclusion region. Measurements were taken less frequently in the central region of the wafer.

Figure 2C:
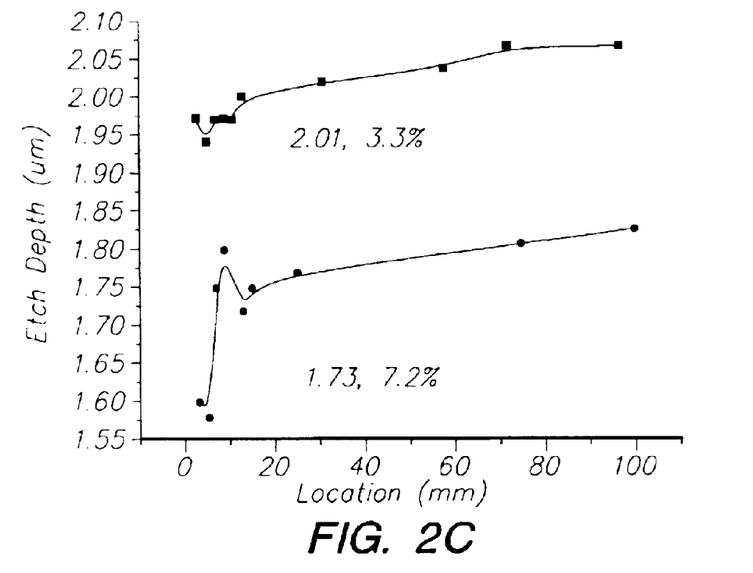
FIG. 2C is a graph showing the effect of the step on the etch depth of etched contacts in BPSG having an etch width of 0.2 micron and an approximately 9:1 aspect ratio.

FIG. 2C is a graph showing the effect of the step on the etch depth of contacts in BPSG. The contacts have an etch width of 0.2 micron and an approximately 9:1 aspect ratio. The following process conditions were used: 1500 Watts RF power at 27 MHz; 1100 Watts RF power at 2 MHz; 52 mTorr process pressure above the wafer; 135 sccm Argon gas; 15 sccm $C_4F_8$ gas; 8 sccm $O_2$ gas; $-10°$ C. temperature of bottom electrode; and 140 second process time.

The upper plot (■) shows etch depth using the electrode arrangement of FIG. 2A. The lower plot (●) shows etch depth using a conventional flat upper electrode arrangement. Location is measured from the edge of the wafer. As can be seen from FIG. 2C, the step on the upper electrode increases the uniformity of the etch depth of the contacts by increasing the etch rate near the wafer perimeter. The numbers beside each plot are the average etch depth and the etch depth uniformity. Etch depth for the contacts in BPSG was determined by SEM.

Figure 2D:
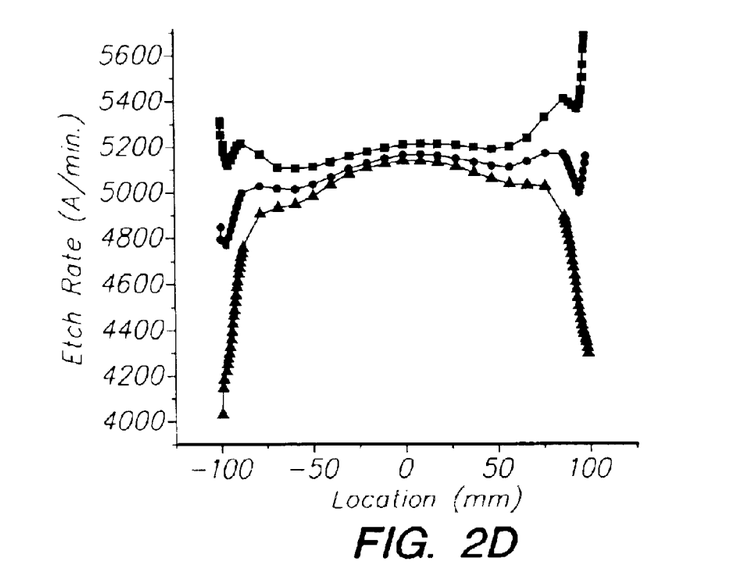
FIG. 2D is a graph showing the effect on the etch rate profile of changing the amount of bevel on an edge ring surrounding the wafer on the lower electrode.

FIG. 2D is a graph showing the effect on the etch rate profile of changing the degree of bevel (β) of the edge ring for a blanket oxide etch using the conditions set forth in the description of FIG. 2B above. The upper plot (■) shows etch rate for a SiC hot edge ring with a 60° bevel. The middle plot (●) shows the etch rate using a Si hot edge ring with a 15° bevel. In both the upper and middle plots, an 8.6" ID stepped electrode was used. The lower plot (▲) shows the etch rate using a flat electrode and a Si hot edge ring having a 15° bevel. As can be seen from the figure, increasing the bevel of the edge ring from 15° to 60° causes an increase in the edge etch rate. The etch rate profile for the SiC hot edge ring with a 60° bevel is an "edge fast" profile with a higher etch rate observed at the edge than near the center of the wafer. It is believed that the bevel on the edge ring causes a perturbation of the plasma sheath which increases the edge etch rate. The use of SiC rather than Si for the hot edge ring material also has the effect of enhancing the etch rate near the edges of the wafer.

Figure 3A:
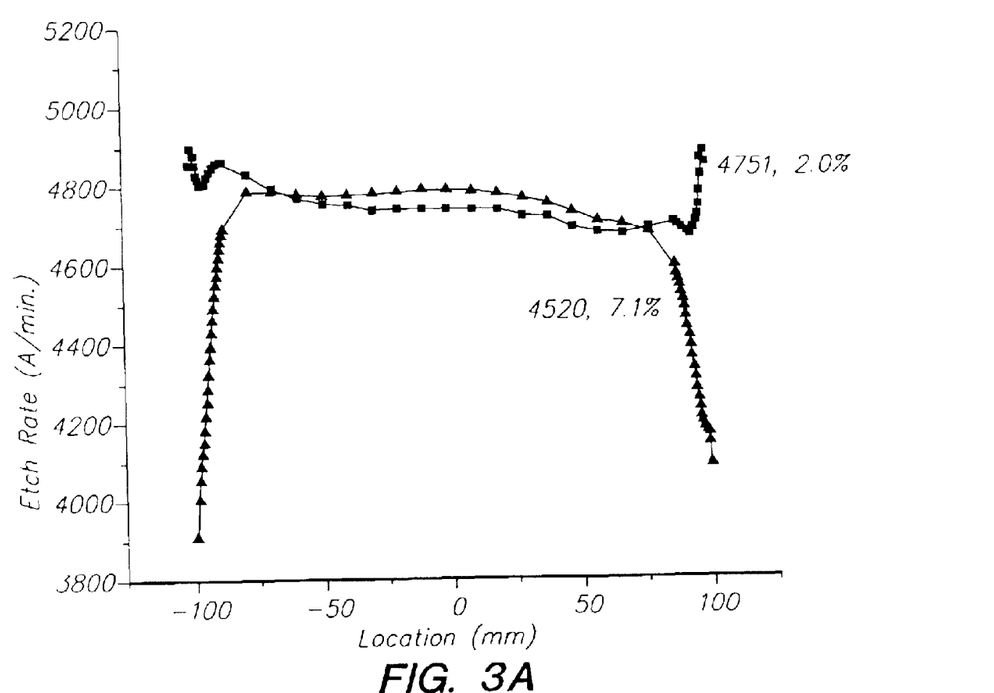
FIG. 3A is a graph showing the etch rate profile across a wafer for a blanket oxide etch using a one-piece Si stepped upper electrode having an 8.7 inch ID step compared to an etch rate profile using a conventional flat Si upper electrode.

FIG. 3A is a graph showing the etch rate profile in a blanket thermal oxide etch using an integral (one-piece) Si stepped upper electrode (■) compared to a blanket oxide etch using a conventional flat Si upper electrode (●). The step on the upper electrode was 0.125 inches thick and had a bevel (α) of 135 degrees. The etching process was carried out using the same process conditions as set forth in FIG. 2B. A Si hot edge ring and a quartz coupling ring were used. The etch rate in Angstroms/minute is plotted as a function of location on the wafer surface measured from the center of the wafer. As can be seen from the figure, the step produces a dramatic improvement in etch rate uniformity near the wafer edge. The numbers beside each plot are the average etch rate and the etch rate uniformity.

Figure 3B:
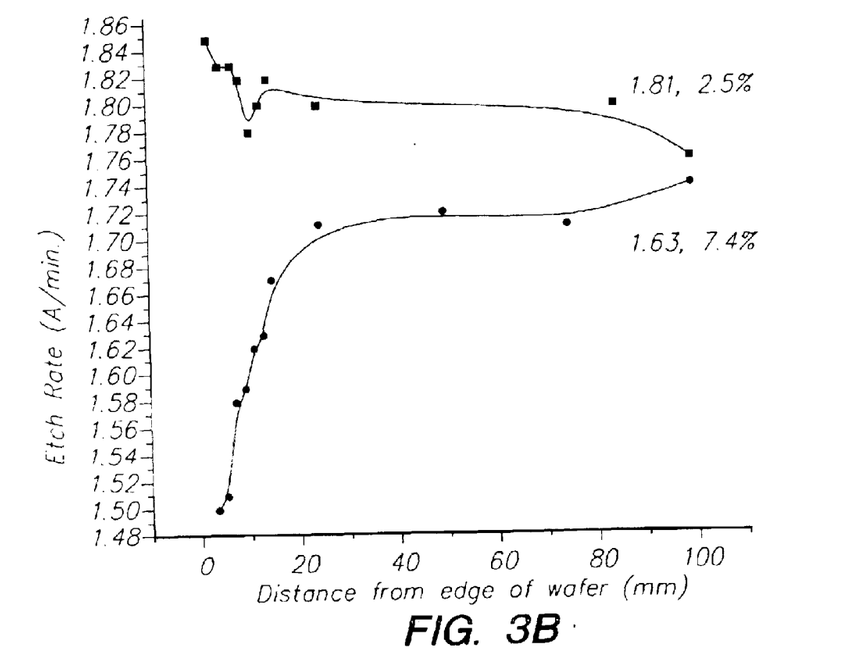
FIG. 3B is a graph showing the etch depth of etched contacts in BPSG using the one-piece Si stepped upper electrode compared to a conventional flat Si upper electrode.

FIG. 3B is a graph showing the effect of the step on the etch depth of contacts in BPSG using the same integral Si stepped upper electrode as described above. The contacts have an etch width of 0.2 micron and an approximately 9:1 aspect ratio. The process conditions set forth in the description of FIG. 2C were used. The upper plot (■) shows etch depth as a function of location using the stepped electrode. The lower plot (●) shows etch depth as a function of location using a conventional flat Si upper electrode measured from the edge of the wafer. As can be seen from the figure, the integral step on the upper electrode increases the uniformity of the etch depth of the features. The numbers beside each plot are the average etch depth and the etch depth uniformity. The etch depth was determined by SEM.

Figure 4A:
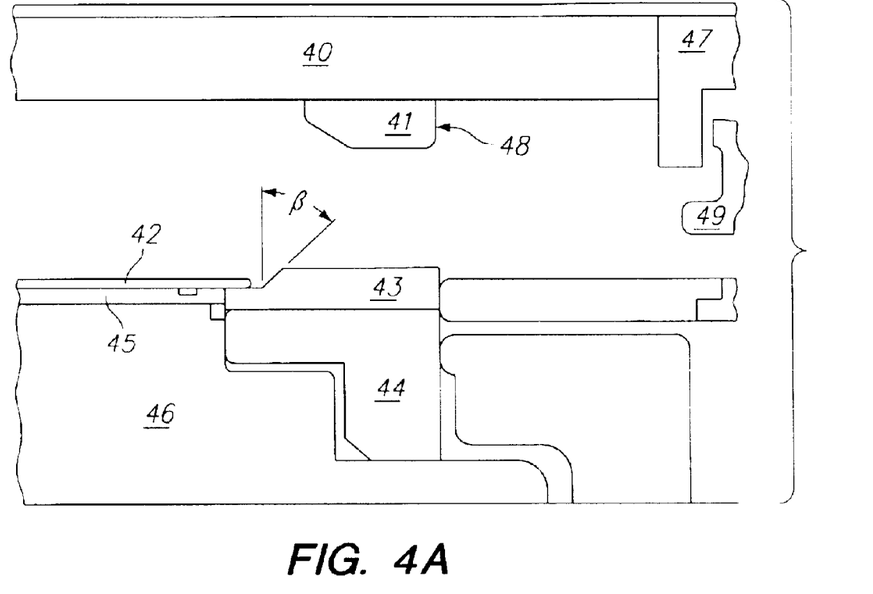
FIG. 4A shows an electrode arrangement including an upper Si electrode with a narrow (small OD) Si step having an outer periphery spaced inwardly of the outer periphery of the electrode.

FIG. 4A shows an electrode arrangement comprising an upper electrode 40 having a narrow (small OD) Si step 41. The step is 0.125 inches thick and has an inside diameter of 8.25 inches. An 8 inch wafer 42 is shown mounted on an electrostatic chuck 45. The lower electrode 46 also includes a quartz coupling ring 44 and an edge ring 43. The edge ring 43 has a 60° bevel (β). Due to the small outside diameter of the step, there is a space between the outside surface of the step 48 and an inner surface of the fixed guard 47. A confinement ring 49 is also shown. Using a Si hot edge ring in this arrangement resulted in a stable plasma under the process conditions set forth in the description of FIG. 2B.

Figure 4B:
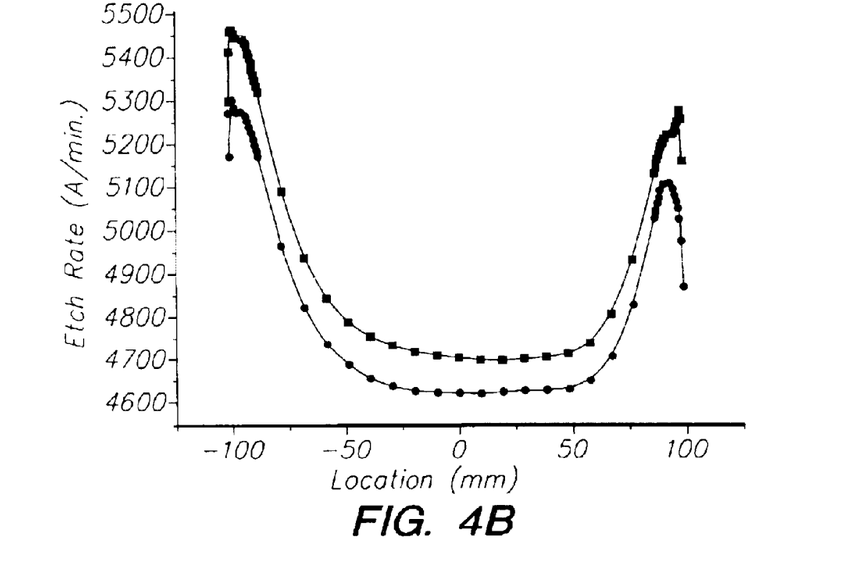
FIG. 4B is a graph showing the effect of the inside diameter of the narrow Si step on the etch rate profile using the arrangement of FIG. 4A.

FIG. 4B is a graph showing the effect of step inside diameter on the etch rate profile using the arrangement of FIG. 4A. A blanket thermal oxide wafer was etched using the same process conditions as set forth in the description of FIG. 2B. The edge ring material in both cases, however, was SiC rather than Si. The 8.0 inch ID step (●) and the 8.25 inch ID step (■) both resulted in an edge fast profile. The 8.0 inch ID step, however, produced a lower overall etch rate.

Figure 4C:
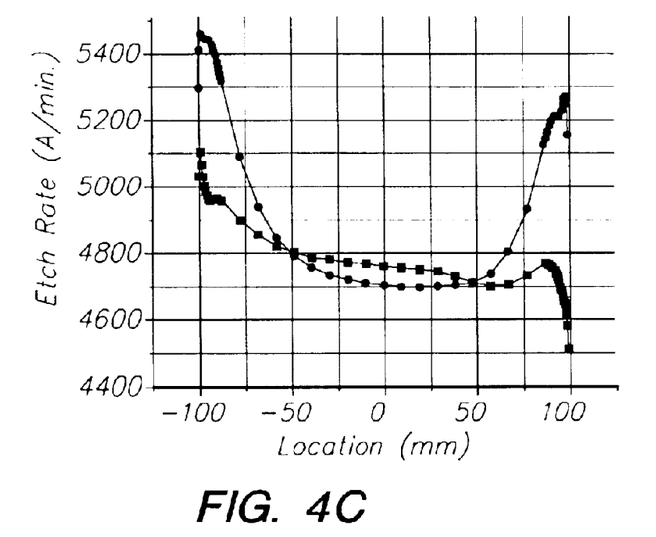
FIG. 4C is a graph showing the effect on etch rate profile of the material of the hot edge ring (HER) using the arrangement of FIG. 4A.

FIG. 4C is a graph showing the effect of changing the material of the edge ring from SiC to quartz. A blanket thermal oxide wafer was etched using the process conditions set forth above in the description of FIG. 2B. The electrode arrangement of FIG. 4A was used. The lower plot (■) shows the etch rate profile using a quartz hot edge ring. The upper plot (●) shows etch rate using a SiC hot edge ring. The dielectric quartz edge ring reduces coupling at the wafer edge and thus produces a significantly lower etch rate near the edge of the wafer. The edge-to-edge non-uniformity of the plots may be due to placement error or non-uniform contact of the step with the upper electrode.

Figure 5:
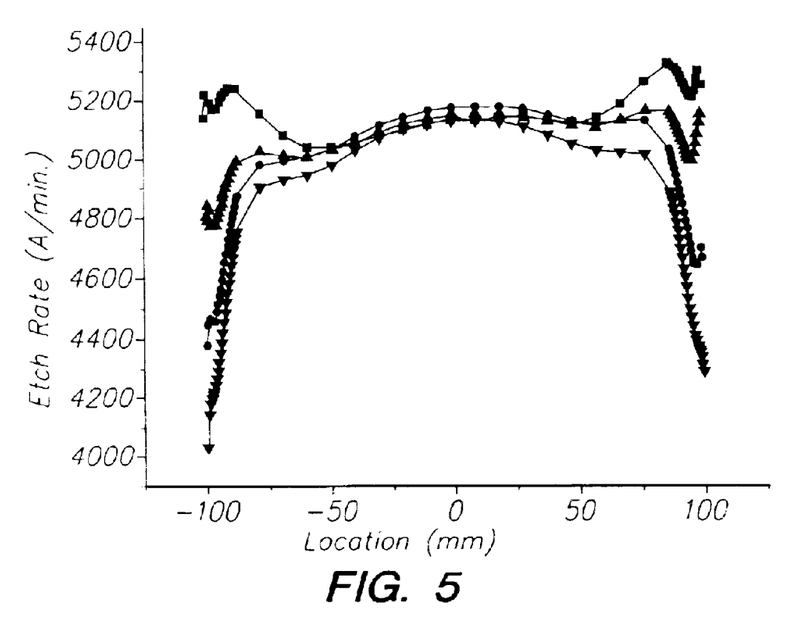
FIG. 5 is a graph showing the effect of step inside diameters on the etch rate profile compared to a flat silicon electrode.

FIG. 5 is a graph showing the effect of step ID on the etch rate profile for a blanket thermal oxide etch using the processing conditions set forth above in the description of FIG. 2B. In all cases, a Si edge ring with a standard 15 degree bevel and a quartz coupling ring were used. The step was made of Si and had a thickness of 0.1 inch. With an 8.25 inch inside diameter step on the upper electrode (■), an edge fast profile is obtained. With an 8.6 inch inside diameter step (▲), a substantially flat etch rate profile is obtained. With a 9.0 inch inside diameter step (●), the effect of the step is reduced significantly and the edge etch rate drops off sharply. For comparison purposes, the etch rate using a conventional flat Si upper electrode (▼) is also shown.

Figure 6A:
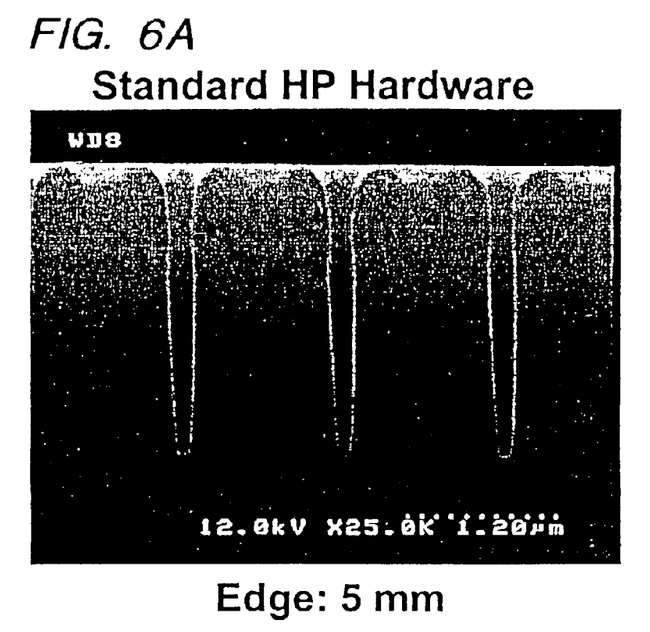
FIGS. 6A and 6B are micrographs showing features etched into the edge and center regions, respectively, of a wafer using a flat Si upper electrode
Figure 6B:
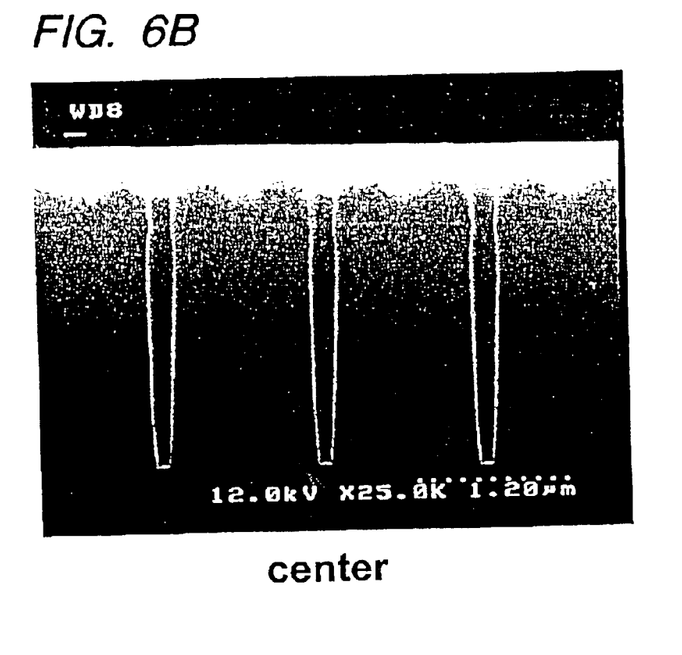
Figure 6C:
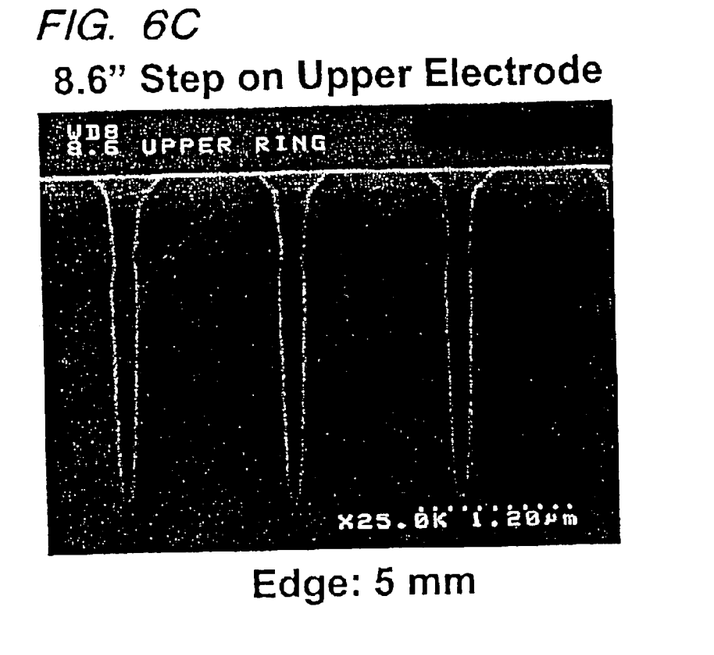
FIGS. 6C and 6D are micrographs showing features etched into the edge and center regions respectively of a wafer using a stepped Si upper electrode.
Figure 6D:
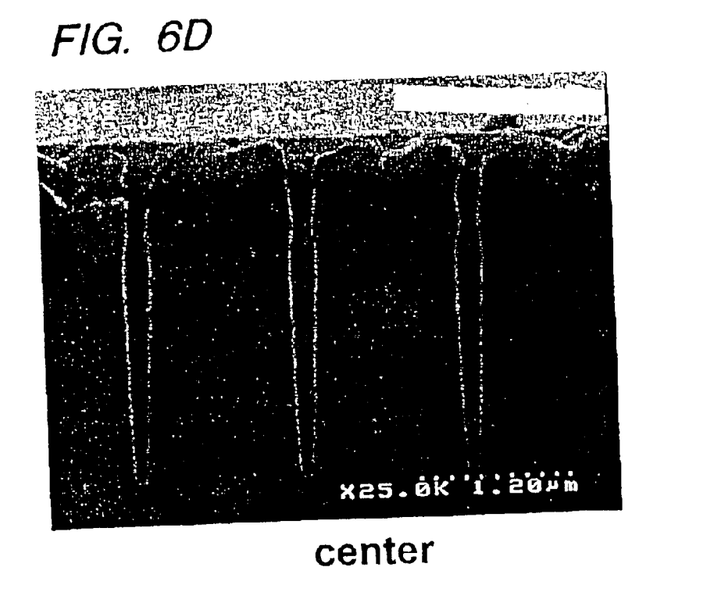

FIGS. 6A–6D are micrographs showing features etched into a blanket thermal oxide wafer. In FIGS. 6A and 6B the features were etched using an electrode arrangement comprising a flat upper electrode. FIG. 6A shows the etched features near the edge of the wafer and FIG. 6B shows the etched features near the wafer center. As can be seen from FIGS. 6A and 6B, the edge features are not as deeply etched as the center features due to the lower etch rate near the edge of the wafer. In FIGS. 6C and 6D the features were etched using an upper electrode having an 0.1 inch thick step having a 8.6 inch inside diameter. FIG. 6C shows the etched features near the edge of the wafer using the stepped electrode and FIG. 6D shows the etched features near the wafer center using the stepped electrode. As can be seen from FIGS. 6C and 6D, the edge and center features have been etched to almost the same depth.

Figure 7:
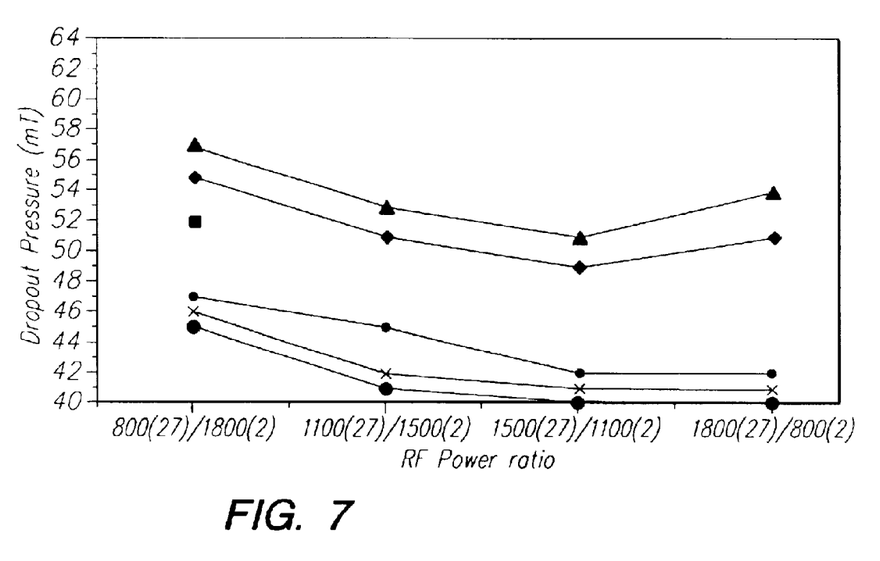
FIG. 7 is a graph showing the plasma dropout pressure versus the RF power ratio using stepped Si upper electrodes having various step geometries versus a flat Si upper electrode.

FIG. 7 is a graph showing the dropout pressure versus the RF power ratio for various step geometries. Dropout pressure is the pressure below which the plasma can no longer be sustained. The RF power ratio is the ratio of the amount of power applied to the lower electrode at a frequency of 27 MHz over the amount of power applied at a frequency of 2 MHz. The tests were conducted using the upper electrode geometries set forth in Table I.

TABLE I

| Graph | Electrode Type | Step Inside Diameter (inches) | Step Outside Diameter (inches) | Step Thickness (inches) |
|---|---|---|---|---|
| ▲ | Separate Step | 8.6 | 10.35 | .1 |
| ♦ | Integral Step | 8.7 | 10.35 | .125 |
| ■ | Integral Step | 8.8 | 10.35 | .125 |

TABLE I-continued

| Graph | Electrode Type | Step Inside Diameter (inches) | Step Outside Diameter (inches) | Step Thickness (inches) |
|---|---|---|---|---|
| • | Separate Step | 8.6 | 9 | .1 |
| X | Flat Electrode | N/A | N/A | N/A |
| ● | Integral Step | 8.8 | 9.5 | .125 |

As can be seen from the plots in FIG. 7, the stepped upper electrodes with the smaller outside diameters (9 and 9.5 inches) allowed the plasma to be sustained at lower pressures than the large outside diameter (10.35 inch) stepped upper electrode. The space outside of the small OD step on the upper electrode provides additional volume for the plasma to occupy. It is believed that this additional volume allows the plasma to be sustained at lower pressures.

Table II illustrates the improvement in etch rate uniformity that can be realized with a stepped upper electrode according to the present invention. Three different types of wafers were tested: blanket thermal oxide, patterned thermal oxide and BPSG contacts. Blanket thermal oxide wafer measurements were made using an ellipsometer with measurements taken along a diameter (edge to edge) of the wafer. BPSG contact depth measurements were made using SEM with measurements taken along a radius (center to edge). Patterned thermal oxide wafer measurements were made using a profilometer and were taken edge to edge. The stepped electrode was a Si electrode with a 0.1 inch Si step having a bevel ($\alpha$) of 150 degrees.

TABLE II

| | | Etch Rate Uniformity (%) | |
|---|---|---|---|
| Wafer | # of points | Flat Electrode | 8.6" ID Step |
| Blanket Thermal Oxide | 18 | ±10% | ±3.3% |
| Patterned Thermal Oxide | 17 | ±7.4% | ±1.3% |
| BPSG Contacts | 9 | ±7.2% | ±3.3% |

The percentages given for etch rate uniformity are calculated using the following equation:

[(Max−Min)/2*Average]*100%.

As can be seen from Table II, the use of the stepped electrode significantly improves the etch rate uniformity.

The inner and outer surfaces of the step will preferably be configured to provide a gradual transition between the electrode and the top of the step. In a preferred embodiment, the step has a trapezoidal cross-section with the inner and outer surfaces of the step forming an angle of 90 degrees or more with the substantially planar central portion of the electrode. However, the step may have other cross-sectional shapes. The inner and outer surfaces of the step do not have to be planar but may be concave or convex. The step may also have a non-planar upper surface. For example, the step could be triangular or hemispherical in cross section or may adopt some other configuration including complex curvatures.

As noted above, the inside diameter or placement of the step relative to the edge of the wafer can be adjusted to achieve a desired etch rate profile. The inside diameter of the step may be less than, equal to or greater than the wafer diameter. Placement of the step can be adjusted in conjunction with other process parameters to provide the desired etch rate profile. Other parameters for determining etch rate profile include the geometric features of the step (such as step thickness and the angle or degree of curvature of the inner surface of the step) as well as the material of the step. The geometric features of the edge ring and the material from which the edge ring is made also affect the etch rate profile. Namely, by changing the dielectric value of the material of the step and the edge ring, the coupling to the bottom electrode can be varied in the wafer edge region. For example, if the edge ring is a dielectric material such as quartz, power can be focused more through the wafer than the edge ring. If, however, a more conductive material such as silicon or silicon carbide is used as the edge ring, the power can be coupled to a greater degree through the edge ring as well as the wafer.

The distance between the electrodes in the parallel plate plasma apparatus has a significant effect on the etch rate profile in the step region. Generally, as the gap width increases, the step on the upper electrode becomes less effective in controlling edge etch rate. Using stepped electrodes at very small gap widths, however, may result in plasma instabilities in the edge region. Selection of the appropriate gap width depends in part upon the gas pressures employed during processing. At higher gas pressures (>75 mTorr to 1 Torr), the gap width may, for example, be in the range of 1.0 to 1.5 cm. At lower pressures (10–75 mTorr), a gap width of 1.3 to 2.0 cm may be more appropriate. The gap width can also be adjusted in conjunction with the frequency of the power applied to the electrodes. Lower frequencies have been found to be effective with larger gap widths and higher frequencies can be used with smaller gap widths.

Although the step as shown in the Figures extends completely around central portion of the front surface of the electrode, it is also possible to include one or more steps which extend only part way around the perimeter of the electrode.

Suitable process gases will depend on the material being etched. For dielectric materials such as silicon oxide, the process gas can include Ar, $O_2$, and fluorocarbons such as $C_4F_8$, $C_3F_6$ and $CHF_3$. These materials are only exemplary, however. Further, the gas may be changed during the etching process.

While the electrode has been referred to and depicted in the Figures as the "top" or "upper" electrode, the apparatus can also be constructed such that the substrate being etched is held with its processed side facing down rather than up as shown. Clamping devices are known in the art which can achieve this orientation. Further, substrates having shapes other than circular wafers can also be processed using the present invention. The step on the upper electrode would, however, generally conform to the shape of the object being processed.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A method of manufacturing a shower head electrode for use in a plasma reaction chamber, said method comprising:

forming a plurality of gas outlets in a central portion of the electrode through which process gas can be delivered from an exposed surface of the electrode; and forming a step projecting from the exposed surface of the electrode, the step being located at a peripheral portion of the electrode and extending at least partially around the central portion of the electrode, the step having a configuration effective in controlling a localized density of the plasma formed adjacent the exposed surface of the electrode.

2. The method of manufacturing the electrode as claimed in claim 1, wherein the central portion of the electrode is formed so as to be substantially planar.

3. The method of manufacturing the electrode as claimed in claim 2, wherein said step is formed with an inner surface adjacent to the central portion of the electrode, a bottom surface substantially parallel to the substantially planar surface of the electrode and an outer surface opposite the inner surface.

4. The method of manufacturing the electrode as claimed in claim 1, wherein the step is formed so as to be located inwardly from the outer periphery of the electrode such that a portion of the electrode extends beyond the step.

5. The method of manufacturing the electrode as claimed in claim 3, wherein the inner surface of the step is formed with an obtuse angle with respect to the substantially planar central portion of the electrode.

6. The method of manufacturing the electrode as claimed in claim 5, wherein the inner surface is formed with an angle of 90 degrees or more with the substantially planar central portion of the electrode and the outer surface of the step is formed with an angle of 90 degrees or more with a plane parallel to the substantially planar central portion of the electrode.

7. The method of manufacturing the electrode as claimed in claim 1, wherein the step is formed as an integral part of a one-piece monolithic stepped electrode.

8. The method of manufacturing the electrode as claimed in claim 1, wherein the step is formed as a separate piece and bonded to the exposed surface of the electrode.

9. The method of manufacturing the electrode as claimed in claim 1, wherein the step is formed as a separate piece and is movably mounted in a groove in the electrode such that thickness of the step can be adjusted.

10. The method of manufacturing the electrode as claimed in claim 1, wherein the step is formed so as to extend completely around the central portion of the electrode.

11. The method of manufacturing the electrode as claimed in claim 1, wherein the electrode is made from a material selected from the group consisting of silicon, silicon carbide, graphite and aluminum.

12. The method of manufacturing the electrode as claimed in claim 1, wherein the electrode is made from silicon.

13. The method of manufacturing the electrode as claimed in claim 1, wherein the electrode is made from silicon carbide.

14. The method of manufacturing the electrode as claimed in claim 1, wherein the electrode is made from graphite.

15. The method of manufacturing the electrode as claimed in claim 1, wherein the electrode is made from aluminum.

* * * * *